United States Patent [19]

Cauchy

[11] Patent Number: 6,091,270

[45] Date of Patent: Jul. 18, 2000

[54] PROCESS FOR MULTIPLYING THE FREQUENCY OF A CLOCK SIGNAL WITH CONTROL OF THE DUTY RATIO, AND CORRESPONDING DEVICE

[75] Inventor: Xavier Cauchy, Meylan, France

[73] Assignee: SGS-Thomson Microelectronics S.A., Gentilly, France

[21] Appl. No.: 09/083,549

[22] Filed: May 22, 1998

[30] Foreign Application Priority Data

Jul. 16, 1997 [FR] France ................................. 97 09022

[51] Int. Cl.[7] ...................................................... H03B 19/00
[52] U.S. Cl. ........................................... 327/122; 327/116
[58] Field of Search .................................... 327/116, 119, 327/122, 147, 156, 269, 270, 271

[56] References Cited

U.S. PATENT DOCUMENTS

| | | | |
|---|---|---|---|
| 4,710,653 | 12/1987 | Yee | 307/518 |
| 4,799,022 | 1/1989 | Skierszkan | 328/20 |
| 5,297,179 | 3/1994 | Tatsumi | 377/47 |
| 5,514,990 | 5/1996 | Mukaine et al. | 327/116 |
| 5,883,534 | 3/1999 | Konodoh et al. | 327/156 |

*Primary Examiner*—Toan Tran
*Assistant Examiner*—Quan Tra
*Attorney, Agent, or Firm*—Theodore E. Galanthay; Allen, Dyer, Doppelt, Milbrath & Gilchrist, P.A.

[57] ABSTRACT

A frequency-doubling block includes an input terminal for the incident signal, a first variable delay cell linked to the input, and an EXCLUSIVE OR gate, one input of which is linked to the output of the first delay cell, the other input of which is linked to the input terminal, and the output of which is able to deliver an output clock signal at twice the frequency of the incident signal. A comparison circuit compares the duty ratio of the output signal with a predetermined reference value and a modulation circuit modulates the value of the first delay as a function of the result of the comparison.

24 Claims, 2 Drawing Sheets

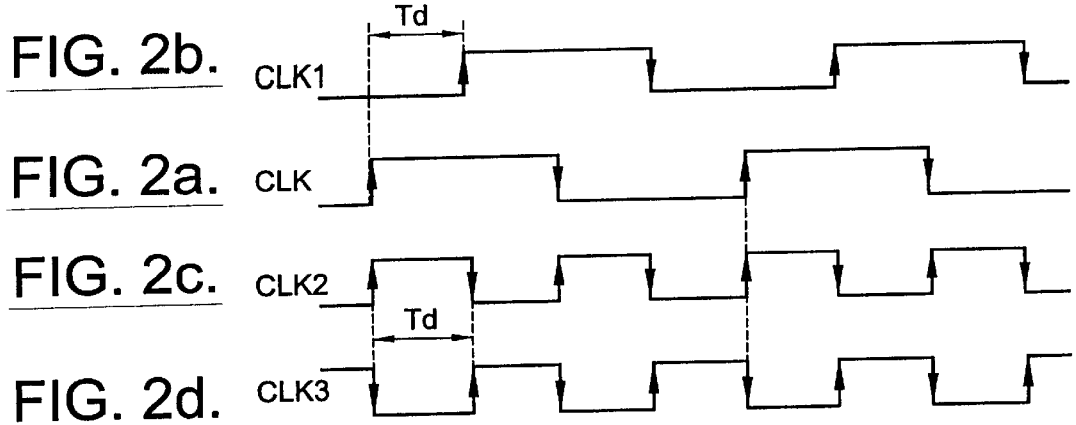
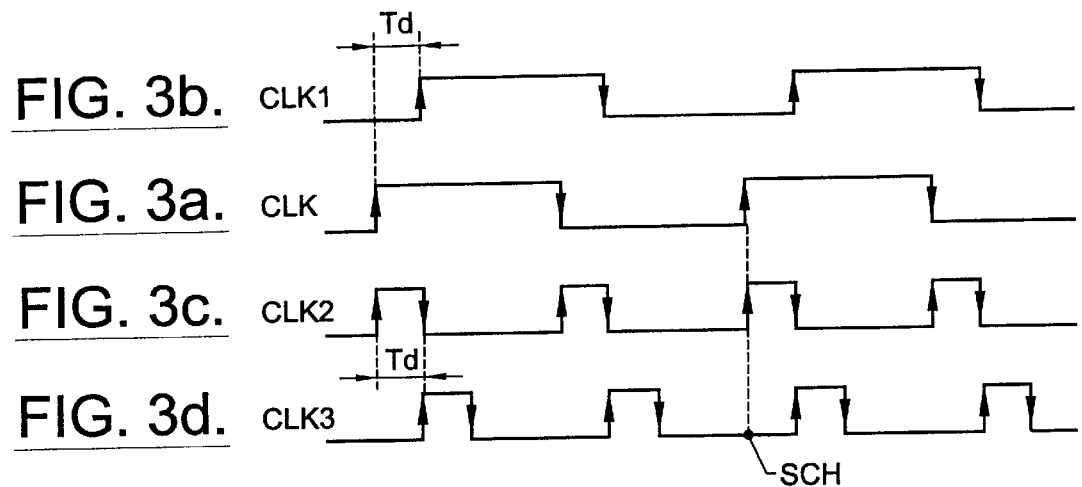
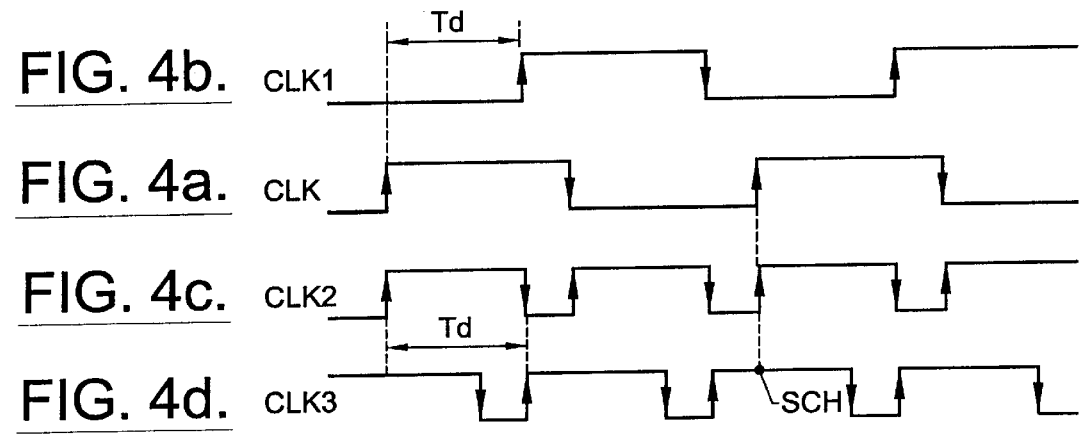

PROCESS FOR MULTIPLYING THE FREQUENCY OF A CLOCK SIGNAL WITH CONTROL OF THE DUTY RATIO, AND CORRESPONDING DEVICE

FIELD OF THE INVENTION

The invention relates to signal processing, and, more particularly, to doubling a frequency of a cyclic signal having relatively steep edges, such as an incident clock signal, so as to obtain an output signal of twice the frequency and at controlled duty ratio. The invention relates, more generally, to the multiplication of such an incident signal by an integer power of 2.

BACKGROUND OF THE INVENTION

One way of doubling the frequency of a clock signal includes using a voltage-controlled oscillator associated with an analog phase-locked loop. Unfortunately, analog components may make it more difficult to incorporate a frequency doubler into a process for making an integrated circuit. It may also be difficult to accurately control the time durations for the high or low states of the output signal. The output signal, if not accurate, may adversely effect another component of another integrated circuit, for example, especially after any distortion of the edges of this output signal as may occur while the signal is transferred via output and input pins of the various chips. Such inaccuracies may, as a consequence, lead to a reduction in the duration of the stable high or low states.

SUMMARY OF THE INVENTION

In view of the foregoing background, it is therefore an object of the invention to provide a frequency doubler for an incident clock signal without having recourse to analog components, thereby making it possible to incorporate the frequency multiplier easily into a process for fabricating an integrated circuit or chip.

A purpose of the invention is also to be able to control the duty ratio of the output clock signal, doubled in frequency with respect to the input clock signal, so as to guarantee that adequate time durations are obtained for the high or low states of the output signal. Accordingly, correct utilization of the output signal by another component of another integrated circuit, for example, is possible even after any distortion of the edges of this output signal. Such distortions may otherwise lead to a reduction in the duration of the stable high or low states, while the doubled output signal is transferred via output and input pins of the various chips.

According to a general characteristic of the invention, the incident clock signal is delayed by a first variable delay; and an output clock signal with twice the frequency of the input signal is generated from this first delayed signal, from the incident clock signal and from a logic function of the EXCLUSIVE OR type. The duty ratio of the output signal is compared with a predetermined reference value and the value of the first delay is modulated as a function of the result of the comparison, so as to obtain an output clock signal of twice the frequency with a controlled duty ratio. In practice, minimum and maximum bounds are thus guaranteed for the duty ratio, the ideal reference value of the latter typically being 50%.

According to one mode of implementation of the process according to the invention, in the duty ratio comparison step, the output signal is delayed by a second variable delay identical to the first delay so as to obtain a second delayed signal. This second delayed signal is sampled using the incident signal. In practice, although all the edges of the incident signal can be used to sample this second delayed signal, sampling will be carried out only on the rising edges of the incident signal. The value of the first and second delays is then modulated as a function of the value of the sampled signal.

Advantageously, each variable delay is produced from a succession of elementary delays whose number is variable, and the value of the delay is modulated by incrementing or decrementing the number of elementary delays in the succession. So, in particular, to avoid too large an oscillation of the value of the duty ratio of the output signal with respect to the ideal value, the value of each variable delay is advantageously modulated less frequently than the result of the comparison of the duty ratio of the output signal is obtained.

The subject of the invention is also a device for multiplying the frequency of an incident clock signal. According to a general characteristic of the invention, this device comprises at least one frequency-doubling block. This frequency-doubling block includes an input terminal for the incident signal; a first variable delay cell linked to the input terminal; and an EXCLUSIVE OR gate, one input of which is linked to the output of the first delay cell, the other input of which is linked to the input terminal of the frequency-doubling block. The output is able to deliver an output clock signal at twice the frequency of the incident signal. The frequency-doubling block also includes comparison means for comparing the duty ratio of the output signal with a predetermined reference value (typically the ideal value of 50%) as well as modulation means for modulating the value of the first delay as a function of the result of the comparison.

According to one embodiment of the invention, the comparison means comprises a second variable delay cell identical to the first variable delay cell and linked to the output of the EXCLUSIVE OR gate, this second variable delay cell delivering a second delayed signal. The comparison means also includes means for sampling the second delayed signal which is: linked to the output of the second delay cell, controlled by the incident signal and delivers a binary sampled signal. The modulation means comprises a control stage possessing an input which receives the binary sampled signal, and an output which delivers a modulation signal to the first and second delay cells so as to increase or decrease the value of the delay as a function of the value of the binary sampled signal.

The control stage advantageously comprises incrementation/decrementation means possessing a control input linked to the input of the control stage (and consequently receiving the sampled signal), an input linked to the output of the control stage and an output linked to the output of the control stage. The incrementation/decrementation means is able to increment or decrement the modulation signal as a function of the value of the binary sampled signal. Each delay cell includes a succession of cascaded delay elements, the respective outputs of at least some of which are linked to the inputs of a multiplexer controlled by the modulation signal. The output of the multiplexer is linked to the output of the delay cell.

Although the sampling means can include, for example, a single D-type flip-flop, it is preferable that the sampling means comprises two flip-flops connected in series and both controlled by the incident signal. This makes it possible to minimize the risks of any metastability of the first flip-flop during sampling.

According to a preferred embodiment of the invention, the control stage of the modulation means comprises a frequency-divider sub-stage which receives the incident signal and delivers an auxiliary control signal having a frequency equal to a predetermined sub-multiple of the frequency of the incident signal. There is also provided an output flip-flop whose input is linked to the output of the incrementation/decrementation means, whose output is linked to the output of the control stage of the modulation means, and whose control input receives the auxiliary control signal. Such a device makes it possible to validate the modulation signal so that it can be accounted for in the delay cells at a lower frequency than that of the incident signal, thus making it possible to minimize the amplitude of the oscillation of the duty ratio with respect to the typically ideal value of 50%.

In particular, to obtain clock signals whose frequency is equal to $2^n$ times the frequency of the clock of the incident signal, n being greater than 1, the device according to the invention advantageously comprises several frequency-doubling blocks connected in series.

BRIEF DESCRIPTION OF THE DRAWINGS

Other advantages and characteristics of the invention will emerge on examining the detailed description of an embodiment and implementation, which are in no way limiting, and the appended drawings in which:

FIGS. 2a–2d, 3a–3d and 4a–4d represent time charts for illustrating various cases of operation of the device of FIG. 1.

DETAILED DESCRIPTION OF THE PREFERRED EMBODIMENTS

Figure 1:
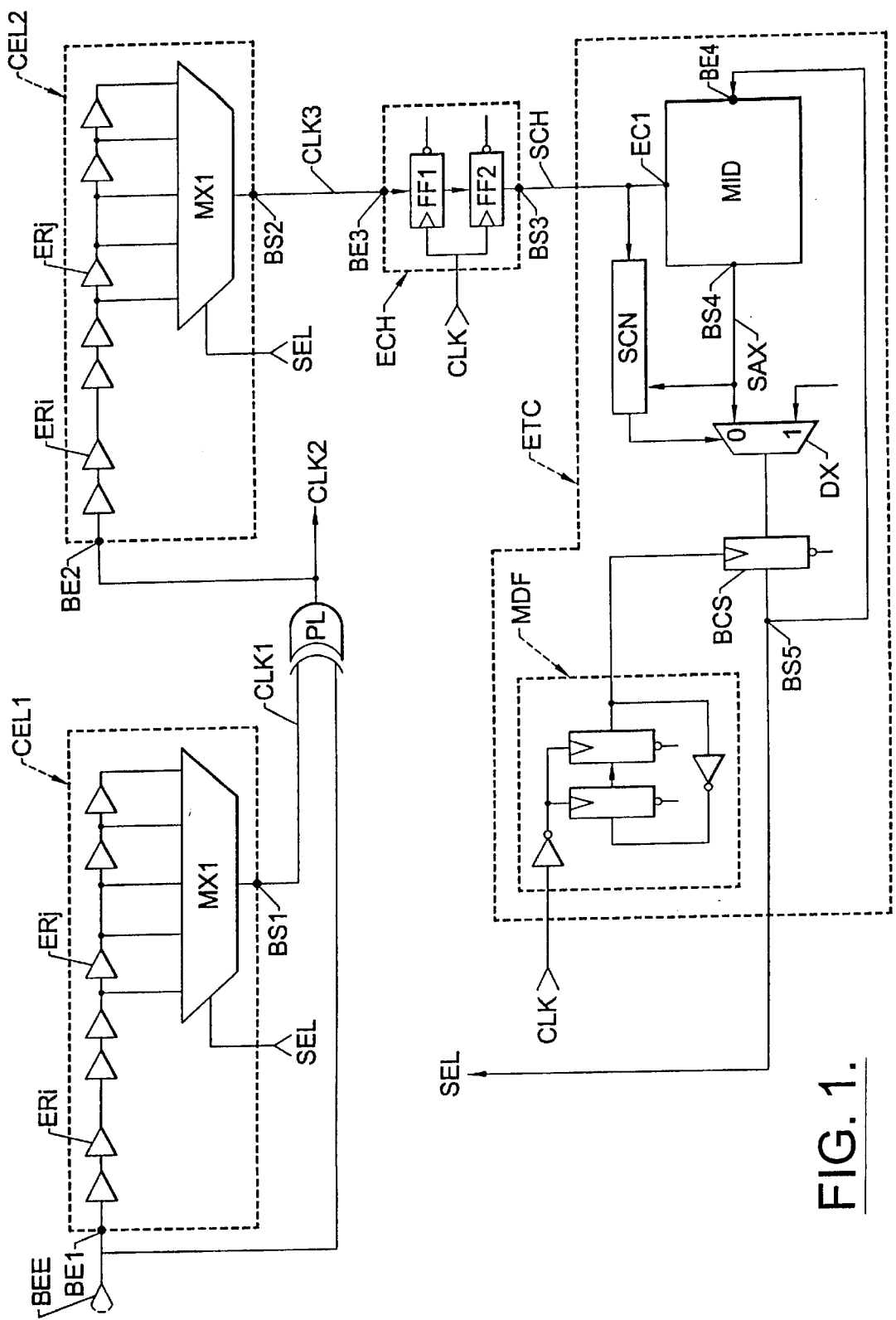
FIG. 1 illustrates diagrammatically an embodiment of a frequency-doubling device according to the invention and allowing implementation of the process according to the invention.

FIG. 1 illustrates a frequency-doubling block possessing an input terminal BEE for receiving an incident clock signal CLK. A first variable delay cell CEL1 possesses an input BE1 linked to the input terminal BEE and an output terminal BS1 linked to a first input of an EXCLUSIVE OR logic gate PL. This first delay cell CEL1 includes a succession of delay elements provided in the illustrated embodiment by non-inverting amplifying elements (buffers) connected in series. A first series of delay elements ERi contributes to the obtaining of a minimum value for the value of the time delay furnished by the cell CEL1, while a second series of elements ERj, whose respective outputs are moreover linked to the inputs of a multiplexer MX1, contribute, as will be seen in greater detail below, to the modulating of the value of the total delay furnished by the cell CEL1. This multiplexer MX1 possesses a control input which receives a modulation signal SEL, the significance of which will be returned to in greater detail later, as well as an output linked to the output BS1 of the output CL1.

The other input of the logic gate PL is linked to the input terminal BEE of the frequency-doubling block. Consequently, the logic gate PL receives on the one hand the incident clock signal CLK and on the other hand a first clock signal CLK1, delivered by the first delay cell CEL1, and delayed with respect to the incident signal CLK by a first delay Td whose value depends on the number of delay elements ERi, ERj actually connected between the input BE1 and the selected input of the multiplexer MX1. Consequently, the output of the logic gate PL, which is in the illustrated embodiment also the output terminal BSS of the frequency-doubling block, delivers an output clock signal CLK2 whose frequency is automatically doubled with respect to that of the incident clock signal CLK.

However, the duty ratio of this output signal CLK2, that is to say the ratio between the duration of the high state (or of the low state) of this output signal and the total duration of the cycle, may be subject to variations on account of possible variations in the value of the delay Td induced by the first delay cell. These variations are caused, in particular, by variations in temperature or supply voltage or variations during the fabrication process.

So as to control this duty ratio, and, in particular, to guarantee the variations in the duty ratio between minimum and maximum bounds with respect to an ideal value of 50%, the doubling block according to the invention includes means for evaluating and comparing the duty ratio of the output signal CLK 2 with the ideal value of 50%. The doubling block also includes modulation means making it possible to modulate the value of the first delay Td induced by the first delay cell CEL1. These various means will now be described in greater detail.

The comparison means firstly includes a second variable delay cell CEL2 possessing an input BE2 linked to the output of the logic gate PL, as well as an output BS2. This second variable delay cell is identical to the first variable delay cell CEL1 and its associated multiplexer MX1 is also controlled by the modulation signal SEL. Although these two cells are in theory and in practice identical so as to induce identical first and second delays Td, it is strongly recommended, so as to further minimize the risk of a difference between these two delays, that the layouts of their respective components be identical. It may also be preferred that these cells be arranged side by side on the integrated circuit or, better still, nested one within the other.

The second cell CEL2 therefore delivers a second signal CLK3 delayed with respect to the signal CLK2 by the delay Td. This second delayed signal CLK3 is delivered to the input BE3 of sampling means ECH here comprising two D-type flip-flops connected in series and labeled FF1 and FF2 respectively. These two flip flops are controlled by the incident clock signal CLK, in practice on the rising edges of the signal CLK.

By sampling the second delayed signal CLK3 it is possible to determine whether the duty ratio of the output clock signal CLK2 is too small or too large, and to do so as a function of the value of the sampled signal SCH delivered at the output BS3 of the sampling means ECH. This signal SCH is in fact a binary signal taking either the value "0", or the value "1" and here representing the value of the signal CLK3 during the rising edges of the incident signal CLK.

This will be understood more clearly by now referring more especially to FIGS. 2a–2d, 3a–3d and 4a–4d. FIGS. 2a to 2d respectively illustrate the four time charts for the signals CLK, CLK1, CLK2 and CLK3 for a value of the delay Td making it possible ideally to obtain a duty ratio of 50% for the output clock signal CLK2. This being so, by reason in particular of variations in chip temperature or supply voltage, the value of the delay Td may vary in one direction or the other.

Thus, represented in FIGS. 3a–3d are the time charts for these four clock signals in the case in which the delay Td is less than the ideal value. Hence, it may be seen in this case that the duty ratio of the output signal CLK2 is less than 50%. It is therefore necessary to increase the value of the delay Td. The overly small value of this delay, and, hence, the overly small value of the duty ratio gives rise, when sampling the second delayed signal CLK3 on the rising edges of the incident signal CLK, to a zero value of this signal CLK3, which zero value is stored in the second flip-flop FF2 and provides one of the values of the sampled signal SCH. In other words, this zero value of the signal SCH implies that the falling edge of the signal CLK3 has already occurred (thus confirming the overly small value of the delay Td), and is therefore too early as compared with the ideal case.

FIGS. 4a–4d illustrate the case in which the value of the delay Td is too high, thus leading to an overly large duty ratio for the output signal CLK2. In this case, when sampling the signal CLK3 on the rising edges of the incident signal CLK, the "1" value of the signal CLK3 (which represents the other value of the sampled signal SCH) is present in the flip-flop FF2. This implies that, compared with the ideal case, the falling edge of the signal CLK3 has not yet occurred, thus clearly showing an overly large delay Td which therefore needs to be reduced.

The sampled signal SCH will then be delivered to the modulation means so that the latter may formulate the modulation signal SEL which controls the multiplexers MX1 of the two cells CEL1 and CEL2. More precisely, in general, if the value of the signal SCH is representative of too small a delay Td, the modulation signal SEL will act on the multiplexer MX1 so as to increase the number of delay elements ERj of each delay cell, and thus increase the value of the delay Td. Conversely, if the value of the signal SCH is representative of too large a delay Td, the signal SEL will control the multiplexer MX1 of each cell in such a way as to decrease the number of delay elements ERj connected between the input and the output of each delay cell, thus decreasing the total value Td of the delay.

More precisely, according to the embodiment illustrated in FIG. 1, the modulation means includes a control stage ETC possessing a control input EC1 which receives the signal SCH and an output BS5 which delivers the modulation signal SEL. This control stage ETC in fact here includes incrementation/decrementation means MID possessing an input BE4 fed back from the output BS5 of the control stage. The input EC1 is thus the control input of these means MID. The latter also includes an output BS4 linked to one of the inputs of a duplexer DX whose output is linked to the input of a D-type output flip-flop BCS. The output of this flip-flop BCS forms the output BS5 of the control stage.

The other input of the duplexer DX is likewise fed back from the output BS5. Furthermore, saturation means SCN, the function of which will be returned to in greater detail below, receives on the one hand the sampled signal SCH and, on the other hand the output signal SAX delivered by the incrementation/decrementation means MID. The output of this saturation means controls the duplexer DX.

Finally, frequency division means MDF, of conventional structure, and an example of which based on two D-type flip-flops and two inverters is illustrated in FIG. 1, are connected between the input terminal BEE of the frequency-doubling block (so as to receive the incident signal CLK), and the control input of the additional flip-flop BCS. During operation, the incrementation/decrementation means MID, constructed in conventional manner from logic gates, increment or decrement the current value of the modulation signal SEL which is present, through feedback, on the input BE4 of these means MID.

The saturation means SCN, likewise constructed in conventional manner by means of logic gates, makes it possible, in combination with the duplexer DX, to avoid overflow. This is because, if the value of the modulation signal SEL at the input BE4 of the means MID has already reached its maximum value and the signal SCH requests an increment, the output signal SAX delivered by the means MID must not be valid since overflow would then occur. In this case, the saturation means SCN control the duplexer DX on its "1" input so as to deliver the old value of the modulation signal SEL to the input of the flip-flop BCS. Naturally, the same holds if the current value of the modulation signal SEL has already reached its minimum value and the signal SCH requests a decrementation.

The control of the multiplexers MX1 of the two delay cells is synchronized at the output of the control stage ETC so as to provide precise control over the instant at which a delay element ERj will actually be added or deleted in each delay cell. More precisely, the sampling means ECH introduces a delay of two clock beats CLK into the feedback loop on account of the presence of the two flip-flops FF1 and FF2. If the updating of the value of the delay in each delay cell were validated at the frequency of the incident clock signal CLK, a maximum oscillation on either side of the ideal position (50%) equivalent to two elementary delay intervals would be obtained, that is to say equivalent to twice the propagation time through a delay element ERi. The presence of the frequency division means MDF and of the output flip-flop BCS makes it possible to validate the updating of the modulation signal SEL at a quarter of the frequency of the incident signal CLK, thereby enabling the oscillation to be limited to one delay interval.

That said, the presence of these frequency division means may prove unnecessary in certain applications, especially if delay elements ERi having extremely low propagation times are chosen. Moreover, the length of the propagation path of the modulation signal SEL to the multiplexers MX1 is such that the multiplexers MX1 are set before the edge of the incident signal has had time to propagate to the first delay element ERj. This is generally the case with the construction techniques and components conventionally used in integrated circuits.

In the case where the current duty ratio of the output signal CLK2 is precisely that which corresponds to a change of level of the signal CLK3 upon a rising edge of the incident signal CLK, there is then a risk of sampling a transition. This risk occurs only for a small number of combinations of operating conditions taking into account in particular the temperature and supply voltage. As soon as such a condition does not apply, for example, if the temperature of the chip increases, a stable level is once again sampled. To better take this risk into account, the value sampled by the first flip-flop FF1 is advantageously reused by a second flip-flop FF2 likewise controlled by the incident signal CLK. This limits the effects of any metastability of the first flip-flop. Thus, the second flip-flop makes it possible to allot a complete cycle of the clock signal CLK so that any metastable ("floating" or "oscillating") value at the output of the first flip-flop FF1 has time to stabilize at "1" or at "0".

Finally, accepting that in an exceptional case metastability may also occur at the output of the second flip-flop FF2, it follows that the sampling signal SCH may take the value "0" or "1" approximately. Consequently, the modulation signal might equally well be incremented as decremented. However, if in fact there has been metastability it is because the duty ratio was equal to 50% and the departure from it by one notch above or below is then of only little importance. Finally, the person skilled in the art will have noted that since in any event the value of the modulation signal will necessarily change, either by incrementation or by decrementation, the next duty cycle will not be able to cause any metastability.

Of course, the number of delay elements ERi and ERj of each delay cell will determine the minimum and maximum delays which may be achieved. They are therefore chosen in such a way as to be suitable for the expected extreme cases. In other words, they are chosen so as to be able to generate the appropriate pulse width with regard to the output signal so as to have a duty ratio of close to 50% under all operating conditions. Furthermore, it is also possible to dispense with the saturation means SCN by suitably adjusting the number of delay elements in each cell (if necessary by deliberately providing too large a number of connectable and disconnectable delay elements) so as to avoid the risk of saturation.

That which is claimed is:

1. A process for doubling the frequency of an incident clock signal, the process comprising the steps of:

delaying the incident clock signal by a first variable delay;

generating an output clock signal with twice the frequency of the input signal from the first delayed signal, from the incident clock signal and from a logic function of the EXCLUSIVE OR type;

comparing the duty ratio of the output signal with a predetermined reference value by delaying the output signal by a second variable delay identical to the first delay so as to obtain a second delayed signal, and sampling this second delayed signal using the incident signal; and modulating the value of the first delay as a function of the result of the comparison, so as to obtain an output clock signal of twice the frequency and with a controlled duty ratio.

2. A process according to claim 1, wherein the modulating step comprises modulating the value of the first and of the second delays as a function of the value of the sampled signal.

3. A process according to claim 1, further comprising the step of producing each variable delay from a succession of elementary delays whose number is variable; and wherein the modulating step comprises modulating the value of each delay by incrementing or decrementing the number of elementary delays in the succession.

4. A process according to claim 1, wherein the modulating step comprises modulating the value of each delay less frequently than obtaining a result of the comparison of the duty ratio of the output signal.

5. A process for doubling the frequency of an incident clock signal, the process comprising the steps of:

delaying the incident clock signal by a first variable delay;

generating an output clock signal with twice the frequency of the input signal from the first delayed signal based upon the incident clock signal and a logic function;

comparing the duty ratio of the output signal with a predetermined reference value by delaying the output signal by a second variable delay identical to the first delay so as to obtain a second delayed signal, and sampling this second delayed signal using the incident signal; and modulating the value of the first delay as a function of the result of the comparison, so as to obtain an output clock signal of twice the frequency and with a controlled duty ratio.

6. A process according to claim 5 wherein the logic function is an EXCLUSIVE OR function.

7. A process according to claim 5, wherein the modulating step comprises modulating the value of the first and of the second delays as a function of the value of the sampled signal.

8. A process according to claim 5, further comprising the step of producing each variable delay from a succession of elementary delays whose number is variable; and wherein the modulating step comprises modulating the value of each delay by incrementing or decrementing the number of elementary delays in the succession.

9. A process according to claim 5, wherein the modulating step comprises modulating that the value of each delay less frequently than obtaining a result of the comparison of the duty ratio of the output signal.

10. A device for multiplying the frequency of an incident clock signal, and comprising:

at least one frequency-doubling block comprising an input terminal for the incident signal, a first variable delay cell connected to the input terminal, an EXCLUSIVE OR gate having a first input connected to an output of the first delay cell, a second input connected to the input terminal, and an output for delivering an output clock signal at twice the frequency of the incident signal, comparison means for comparing a duty ratio of the output clock signal with a predetermined reference value, said comparison means comprising a second variable delay cell identical to the first variable delay cell connected to the output of the EXCLUSIVE OR gate and delivering a second delayed signal, and sampling means for sampling the second delayed signal which is connected to an output of the second delay cell, said sampling means being controlled by the incident signal and delivering a binary sampled signal, and modulation means for modulating a value of the first delay as a function of the result of the comparison.

11. A device according to claim 10, wherein said modulation means comprises a control stage having an input which receives the binary sampled signal, and an output which delivers a modulation signal to the first and second delay cells so as to increase or decrease the value of the delay as a function of the value of the binary sampled signal.

12. A device according to claim 11, wherein said control stage comprises incrementation/decrementation means having a first control input connected to the input of the control stage, a second input connected to the output of the control stage, and an output connected to the output of the control stage, said incrementation/decrementation means for to incrementing or decrementing the modulation signal as a function of the value of the binary sampled signal.

13. A device according to claim 12, further comprising a multiplexer controlled by the modulation signal; wherein each delay cell includes a succession of cascaded delay elements, the respective outputs of at least some of which are linked to the inputs of the multiplexer; and wherein an output of the multiplexer is linked to the output of the delay cells.

14. A device according to claim 10, wherein said sampling means comprises two flip-flops connected in series and both controlled by the incident clock signal.

15. A device according to claim 12, wherein the control stage comprises:

a frequency-divider sub-stage which receives the incident clock signal and delivers an auxiliary control signal having a frequency equal to a predetermined submultiple of the frequency of the incident clock signal; and an output flip-flop having an input connected to the output of the incrementation/decrementation means, having an output connected to the output of the control stage, and having a control input receiving the auxiliary control signal.

16. A device according to claim 10, wherein said at least one frequency-doubling block comprises a plurality of frequency-doubling blocks connected in series.

17. A device for multiplying the frequency of an incident clock signal, and comprising:

at least one frequency-doubling block comprising
an input terminal for the incident signal,
a first variable delay cell connected to the input terminal,
a logic circuit having a first input connected to an output of the first delay cell, a second input connected to the input terminal, and an output for delivering an output clock signal at twice the frequency of the incident signal,
a comparison circuit for comparing a duty ratio of the output clock signal with a predetermined reference value, said comparison circuit comprising
a second variable delay cell identical to the first variable delay cell connected to the output of said logic circuit and delivering a second delayed signal, and
a sampling circuit for sampling the second delayed signal which is connected to an output of the second delay cell, said sampling circuit being controlled by the incident signal and delivering a binary sampled signal, and
a modulation circuit for modulating a value of the first delay as a function of the result of the comparison.

18. A device according to claim 17, wherein said logic circuit comprises an EXCLUSIVE OR gate.

19. A device according to claim 17, wherein said modulation circuit comprises a control stage having an input which receives the binary sampled signal, and an output which delivers a modulation signal to the first and second delay cells so as to increase or decrease the value of the delay as a function of the value of the binary sampled signal.

20. A device according to claim 19, wherein said control stage comprises incrementation/decrementation circuit having a first control input connected to the input of the control stage, a second input connected to the output of the control stage, and an output connected to the output of the control stage, said incrementation/decrementation circuit for to incrementing or decrementing the modulation signal as a function of the value of the binary sampled signal.

21. A device according to claim 20, further comprising a multiplexer controlled by the modulation signal; wherein each delay cell includes a succession of cascaded delay elements, the respective outputs of at least some of which are linked to the inputs of the multiplexer; and wherein an output of the multiplexer being linked to the output of the delay cells.

22. A device according to claim 17, wherein said sampling circuit comprises two flip-flops connected in series and both controlled by the incident clock signal.

23. A device according to claim 19, wherein the control stage comprises:

a frequency-divider sub-stage which receives the incident clock signal and delivers an auxiliary control signal having a frequency equal to a predetermined submultiple of the frequency of the incident clock signal; and an output flip-flop having an input connected to the output of the incrementation/decrementation means, having an output connected to the output of the control stage, and having a control input receiving the auxiliary control signal.

24. A device according to claim 17, wherein said at least one frequency-doubling block comprises a plurality of frequency-doubling blocks connected in series.

* * * * *